United States Patent
Cho

(10) Patent No.: US 7,851,293 B2
(45) Date of Patent: Dec. 14, 2010

(54) METHOD FOR FORMING VERTICAL CHANNEL TRANSISTOR OF SEMICONDUCTOR DEVICE

(75) Inventor: Yun-Seok Cho, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 199 days.

(21) Appl. No.: 12/334,406

(22) Filed: Dec. 12, 2008

(65) Prior Publication Data
US 2009/0291551 A1    Nov. 26, 2009

(30) Foreign Application Priority Data
May 21, 2008    (KR) .................. 10-2008-0047084

(51) Int. Cl.
*H01L 21/8238* (2006.01)
(52) U.S. Cl. .......... 438/206; 257/E21.41; 257/E21.629; 257/E21.643; 257/E21.693; 438/209; 438/212
(58) Field of Classification Search ............ 257/E21.41, 257/E21.629, E21.643, E21.693; 438/206, 438/209, 212
See application file for complete search history.

(56) References Cited

U.S. PATENT DOCUMENTS

| | | | | |
|---|---|---|---|---|
| 7,247,570 B2 * | 7/2007 | Thomas | ...................... | 438/700 |
| 7,271,413 B2 * | 9/2007 | Chance et al. | ................. | 257/68 |
| 7,631,874 B2 * | 12/2009 | Webb | .......................... | 273/292 |
| 7,663,183 B2 * | 2/2010 | Brar et al. | .................... | 257/328 |
| 2007/0190766 A1 * | 8/2007 | Seo et al. | ..................... | 438/585 |

FOREIGN PATENT DOCUMENTS

| | | |
|---|---|---|
| KR | 1019990088580 | 12/1999 |
| KR | 100506336 | 7/2005 |

OTHER PUBLICATIONS

Korean Notice of Allowance for Korean Patent Application No. 10-2008-0047084.

* cited by examiner

*Primary Examiner*—Asok K Sarkar
(74) *Attorney, Agent, or Firm*—Lowe Hauptman Ham & Berner LLP

(57) ABSTRACT

A method for forming a vertical channel transistor in a semiconductor device includes providing a substrate, forming pillar patterns extending perpendicular from the upper surface of the substrate, forming a spin on carbon (SOC) layer in a gap region between the pillar patterns, forming photoresist patterns above a resultant structure where the SOC layer is filled to expose a region for an isolation trench, etching the SOC layer between the photoresist pattern barriers to expose the region for the isolation trench, and etching the exposed structure to a certain depth forming the isolation trench.

15 Claims, 7 Drawing Sheets

METHOD FOR FORMING VERTICAL CHANNEL TRANSISTOR OF SEMICONDUCTOR DEVICE

CROSS-REFERENCE TO RELATED APPLICATIONS

The present application claims priority of Korean patent application number 10-2008-0047084, filed on May 21, 2008, which is incorporated herein by reference in its entirety.

BACKGROUND

Various exemplary embodiments relate to a method for fabricating a semiconductor device, and more particularly, to a semiconductor device having pillars for defining an isolation trench and a method for forming an isolation trench between the pillars of a vertical channel transistor.

As semiconductor devices can be highly integrated, the cell dimensions integrated on an associated wafer can be decreased. Since this decrease in dimension can lead to a decrease in the channel length of a planar-type transistor, a shorting effect such as a Drain Induced Barrier Lowering (DIBL), a hot carrier effect or a punch through effect can occur. Therefore, with a planar-type transistor structure, there exists a limitation on improving the integration degree of the semiconductor devices.

To overcome the above integration limitation of the planar-type transistor, researchers have introduced a vertical channel transistor structure designed to increase the integration degree while securing the channel length of the transistor.

FIG. 1A is a plan view describing a typical semiconductor device including a vertical channel transistor.

Referring to FIG. 1A, the vertical channel transistor includes a plurality of pillar patterns P vertically protruding from a substrate 100. The pillar patterns P are arranged having a width parallel to the upper surface of the substrate 100 and extending perpendicular from the upper surface of the substrate 100. Herein, the substrate 100, at a portion centered between the pillar patterns P includes an isolation trench T isolating an impurity region for a bit line. A word line WL is formed to electrically connect a surrounding gate electrode (not shown), which surrounds the lower sidewalls of pillar patterns P above the substrate 100 and extending parallel to the upper surface of the substrate 100.

FIGS. 1B to 1D display cross-sectional views of the semiconductor device of FIG. 1A taken along the second direction B-B'. The figs. describe a method for fabricating a typical semiconductor device which includes a vertical channel transistor.

Referring to FIG. 1B, island-type first hard mask patterns 110 are formed above the substrate 100. The pillar patterns are formed by using first hard mask patterns 110 as barriers and then etching the substrate 100 to a certain depth. Herein, the first hard mask patterns 110 preferably include a nitride layer 110A in a lower portion and an oxide layer 110B in an upper portion. In the lower portion 110A of the first hard mask patterns 110, a pad oxide layer 120 can be formed.

A gate insulation layer 130 is formed encapsulating the resultant pillar patterns P and over the substrate. A surrounding gate electrode 140 is formed on lower sidewalls of pillar patterns P surrounding the gate insulation layer 130. Nitride layer spacers 150 are formed encapsulating the resultant gate insulation layer 130 and the surrounding gate electrode 140.

An impurity region (not shown) for a bit line is then formed by implanting impurity ions into the substrate 100 between the pillar patterns P. An insulation layer 160, including an oxide layer, is formed surrounding the pillar patterns P.

Second hard mask patterns 170 are formed above the resultant structure. Line-type photoresist patterns 180 are formed above the second hard mask patterns 170 covering the pillar patterns P and exposing a region for an isolation trench T. However, limitations in the fabrication process may cause a miss match between the photoresist patterns 180 and the region for the isolation trench T.

Referring to FIG. 1C, the second hard mask patterns 170 and the insulation layer 160 are etched by using the photoresist patterns 180 as an etch barrier, thereby exposing the substrate 100 in the isolation trench region between the pillar patterns P.

Herein, when the photoresist patterns 180 and the region for the isolation trench T are mismatched with each other by lack of an overlay margin, the nitride spacers 150 formed on the sidewalls of the pillar patterns P can be damaged. In this case, the surrounding gate electrode 140 and the pillar patterns P may also be exposed and damaged.

While the nitride spacers 150 on the sidewalls of one pillar pattern P are damaged, the insulation layer 160 overlay remains on the sidewalls of the other pillar pattern P. Thus, a plurality of the isolation trenches T over the substrate 100 may be formed having irregular widths W.

Referring to FIG. 1D, the exposed substrate 100 is selectively etched to a certain depth $D_r$. Thus, the isolation trench T extending in the first direction is formed in the substrate 100 between the pillar patterns P. Furthermore, low etch selectivity of the nitride spacers 150 to the substrate 100 may cause further damage to the nitride spacers 150. Accordingly, since the nitride spacers 150 cannot function as an etch barrier during a subsequent damascene word line formation process, the surrounding gate electrode 140 may become more exposed, resulting in damage.

As semiconductor devices become more highly integrated, limitations caused by the lack of the overlay margin are getting harder to overcome. Thus, the integration of semiconductor devices reaches the limits during a typical semiconductor device formation process.

The above limitations in the semiconductor device fabrication process do not only occur in cases including bar-type pillar patterns P where the upper and lower widths are the same, but also in cases with the pillar patterns having recessed lower widths.

SUMMARY

Various exemplary embodiments are directed to providing a method for fabricating a semiconductor device with an isolation trench in a vertical channel transistor.

In accordance with one or more of the embodiments, a spin on carbon (SOC) layer fills a gap region between the pillar patterns and an isolation trench is then formed by etching the SOC layer and the substrate.

When photoresist patterns for an isolation trench are formed, widths of the photoresist patterns are wider than the width of the isolation trench. Thus, in an isolation trench, a not open phenomenon is prevented.

In accordance with an aspect of the various exemplary embodiments, there is provided a method for forming a vertical channel transistor in a semiconductor device, the method including: providing a substrate, forming pillars over the substrate, forming a spin on carbon (SOC) layer in a gap region between the pillars, forming photoresist patterns over a resultant structure where the SOC layer is filled to expose a region for an isolation trench, etching the SOC layer by using the photoresist patterns as an etch barrier to expose the region for the isolation trench, and etching the exposed structure to a certain depth to form the isolation trench.

In accordance with another aspect of the various exemplary embodiments, there is provided a method for forming a vertical channel transistor in a semiconductor layer, the method including: providing a substrate; forming pillar patterns extending perpendicularly from an upper surface of the substrate; forming spacers encapsulating the resultant pillar patterns and above the substrate; forming a sacrificial layer having a high etch selectivity with respect to the spacers in a gap region between the pillar patterns; forming photoresist patterns above the pillar patterns where the sacrificial layer is formed to expose the substrate in a region for an isolation trench, wherein the width of the photoresist patterns is wider than the width of the region to be etched for the isolation trench; removing the sacrificial layer by using the photoresist patterns as an etch barrier to expose the substrate in the region for the isolation trench; and etching the exposed substrate to a certain depth to form the isolation trench.

Other objects and advantages of the various exemplary embodiments can be understood by the following description, and become more apparent with reference to one or more of the embodiments.

BRIEF DESCRIPTION OF THE DRAWINGS

Various embodiments are illustrated by way of example, and not by limitation, in the figures of the accompanying drawings.

DESCRIPTION OF EMBODIMENTS

Figure 1A:
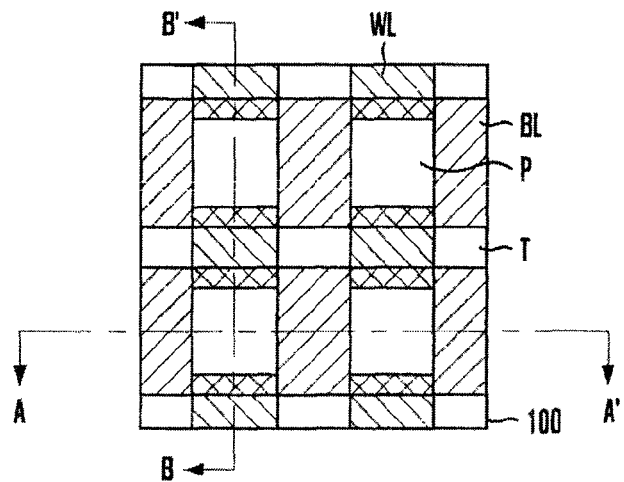
FIG. 1A is a plan view describing a typical semiconductor device including a vertical channel transistor.
Figure 1B:
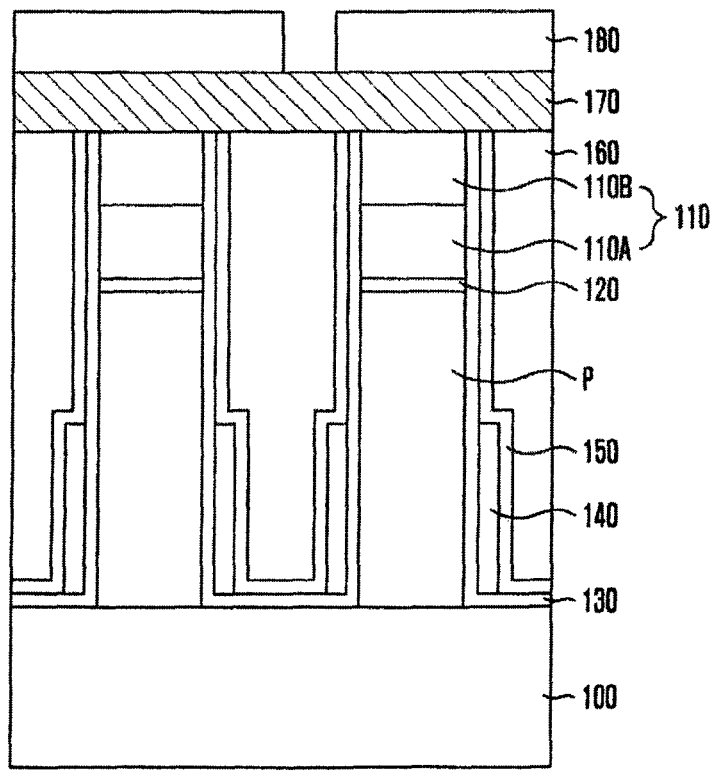
FIGS. 1B to 1D are cross-sectional views of the semiconductor device of FIG. 1A taken along a second direction B-B' to describe a method for fabricating a typical semiconductor device including a vertical channel transistor.
Figure 1C:
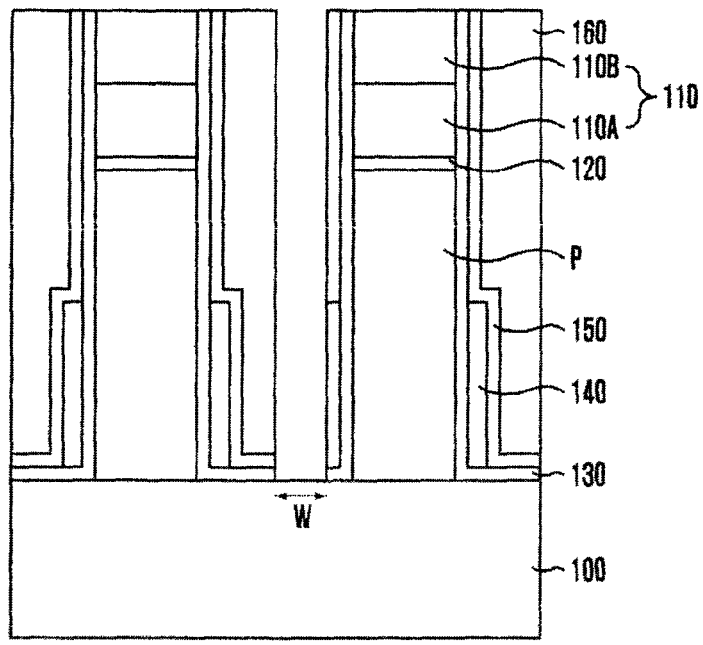
Figure 1D:
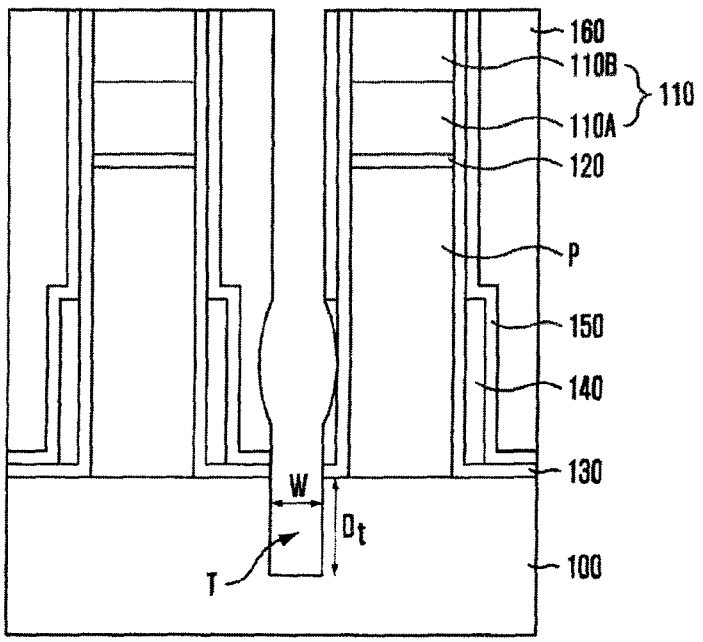

The exemplary embodiments relate to a method for forming an isolation trench of a vertical channel transistor. In the below description, known structures that are not related to the various exemplary embodiments may not be described. Also, the same reference numerals are used for the same element throughout each of the drawings of one or more embodiments.

In the figures, the dimensions of layers and regions are exaggerated for clarity of illustration. It will also be understood that when a layer (or film) is referred to as being 'on/under' another layer or substrate, it can be directly on/under the other layer or substrate, or one or more intervening layers may also be present. In addition, it will also be understood that when a layer is referred to as being 'between' two layers, it can be the only layer between the two layers, or one or more intervening layers may also be present.

Figure 2A:
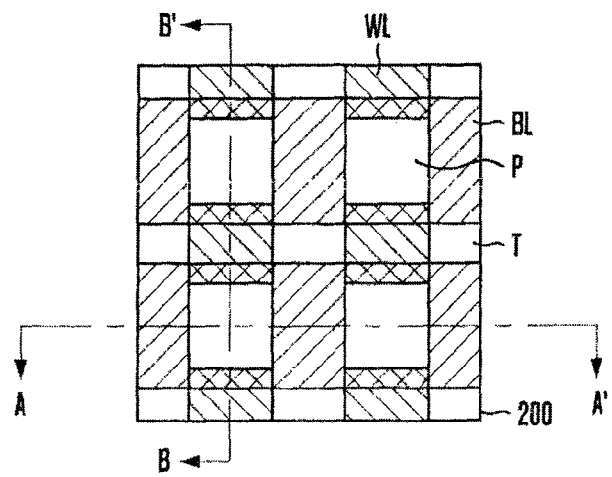
FIG. 2A is a plan view describing a semiconductor device including a vertical channel transistor in accordance with the first embodiment.

FIG. 2A is a plan view describing a semiconductor device including a vertical channel transistor in accordance with a first embodiment.

Referring to FIG. 2A, the vertical channel transistor includes a plurality of pillar patterns P vertically protruding from a substrate 200. The pillar patterns P are arranged having a width parallel to the upper surface of the substrate 200 and extending perpendicular from the upper surface of the substrate 200. Herein, the substrate 200, at a portion centered between the pillar patterns P includes an isolation trench T isolating an impurity region for a bit line. A word line WL is formed to electrically connect a surrounding gate electrode (not shown), which surrounds the lower sidewalls of pillar patterns P above the substrate 200 and extending parallel to the upper surface of the substrate 200.

Figure 2B:
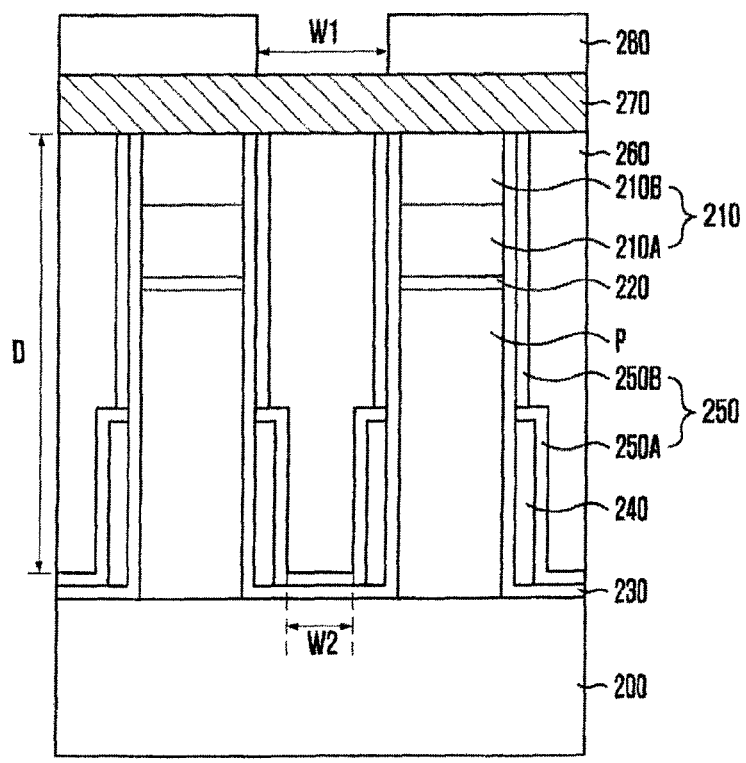
FIGS. 2B to 2D are cross-sectional views describing a method for fabricating a semiconductor device including a vertical channel transistor in accordance with the first embodiment.
Figure 2C:
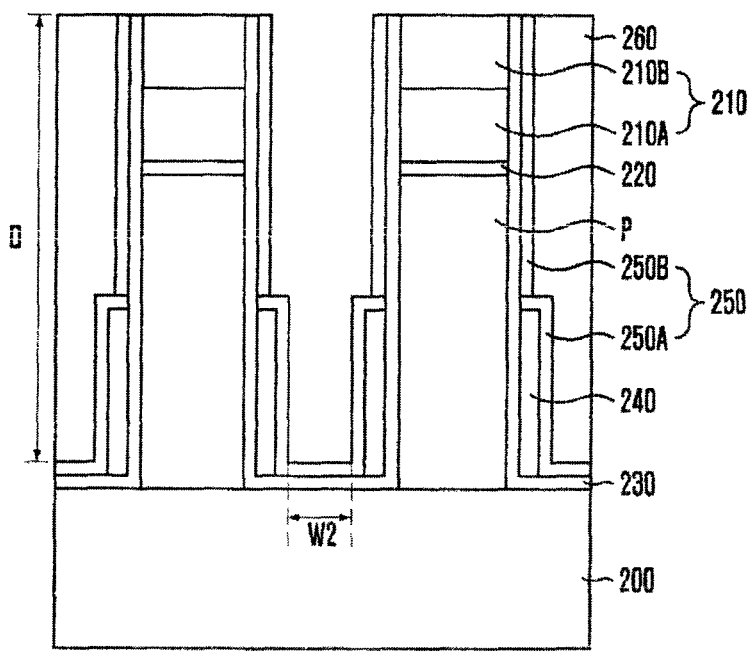
Figure 2D:
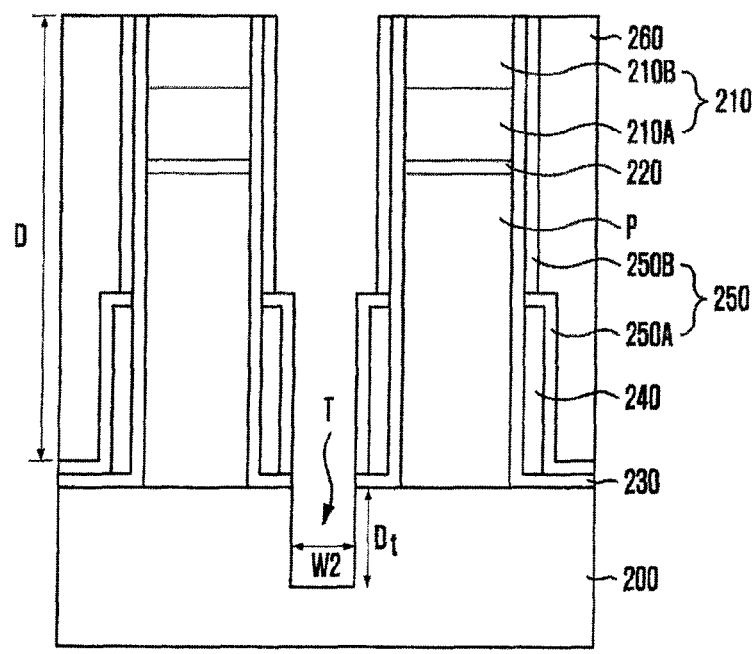

FIGS. 2B to 2D display cross-sectional views of FIG. 2A taken along a second direction B-B'. The views describe a method for fabricating a semiconductor device including a vertical channel transistor in accordance with the first embodiment.

Hereinafter, the first embodiment describes a method for fabricating a semiconductor device including a vertical channel transistor with bar-type pillar patterns P wherein an upper portion 210B and a lower portion 210A of the pillar patterns P have substantially the same width. This embodiment can also apply to methods for fabricating the semiconductor device including pillar patterns P wherein the lower portion 210A is recessed.

Referring to FIG. 2B, island-type first hard mask patterns 210 are formed above the substrate 200. The pillar patterns are formed by using first hard mask patterns 210 as barriers and then etching the substrate 200 to a certain depth D. Herein, the first hard mask patterns 210 preferably include a nitride layer 210A in a lower portion and an oxide layer 210B in an upper portion. In the lower portion 210A of the first hard mask patterns 210, a pad oxide layer 220 can be formed.

A gate insulation layer 230 is formed encapsulating the resultant pillar patterns P and over the substrate. A surrounding gate electrode 240 is formed on lower sidewalls of pillar patterns P surrounding the gate insulation layer 230. Nitride layer spacers 250 are formed encapsulating the resultant gate insulation layer 230 and the surrounding gate electrode 240.

Spacers 250 are formed encapsulating the resultant gate insulation layer 230 and the surrounding gate electrode 240, thus, protecting the pillar patterns P, the gate insulation layer 230 and the surrounding gate electrode 240 during the isolation trench T formation process. Herein, a nitride layer 250A is deposited encapsulating a resultant structure including the surrounding gate electrode 240 and then an oxide layer 250B is deposited thereon. Thus, the spacers 250 are preferably formed in a stack configuration with the nitride layer 250A in the lower portion and the oxide layer 250B in the upper portion.

An impurity region for a Bit Line (not shown) is then formed by implanting impurity ions into the substrate 200 between the pillar patterns P. A sacrificial layer 260 having a high etch selectivity with respected to the spacers 250 is deposited surrounding a resultant structure including the impurity region.

Herein, the sacrificial layer 260 preferably includes a spin on carbon (SOC) layer. The SOC layer has excellent gap fill characteristics and thus, it is possible to completely fill the gap between the pillar patterns P. The SOC layer also has excellent planarization characteristics. Furthermore, since an etch selectivity of the SOC layer with respect to the oxide layer is high, the SOC layer can be selectively removed while leaving the oxide layer 250B. Particularly, the SOC layer can be easily removed through a plasma strip process while leaving the other layers.

Second hard mask patterns 270 are formed above the resultant structure where the sacrificial layer 260 is formed. Line-type photoresist patterns 280 are formed above the second hard mask patterns 270 covering the pillar patterns P and exposing a region for an isolation trench T.

A first width w1 between the photoresist patterns 280 may be wider than a second width W2 of the region for the isolation trench T. Herein, the second width W2 of the region for the isolation trench T indicates the width between neighboring pillar patterns P. Specifically, the second width W2 indicates the width of the substrate 200 exposed by the spacers 250 formed on sidewalls of the pillar patterns P.

Referring to FIG. 2C, the second hard mask patterns 270 and the sacrificial layer 260 are etched by using the photoresist patterns 280 as an etch barrier to expose the substrate 200 in the region for the isolation trench T.

Herein, since the sacrificial layer 260 includes a material having a high etch selectivity with respect to the spacers 250, damage of the spacers 250 is minimized and the sacrificial layer 260 can be selectively removed. Particularly, when the spacers 250 include the SOC layer and have the nitride layer 250A in the lower portion and the oxide layer 250B in the upper portion, the etch selectivity of the SOC layer with respect to the oxide layer 250B is high. Thus, the sacrificial layer 260 is selectively removed while leaving the spacers 250.

The first width w1 between the photoresist patterns 280 is wider than the second width W2 of the region for the isolation trench T. Thus, a not open phenomenon can be prevented. Furthermore, a plurality of regions for isolation trenches are formed to have a second width W2.

Referring to FIG. 2D, after the sacrificial layer 260 is removed, the exposed substrate 200 is selectively etched to a certain depth $D_t$. Thus, the isolation trench T extending perpendicular to the upper surface of the substrate is formed in the substrate 200 between the pillar patterns P. Herein, since the substrate 200 is exposed by an amount of the second width W2, the isolation trench T is etched to have the same width W2.

Herein, when the spacers 250 include the nitride layer 250A in the lower portion and the oxide layer 250B in the upper portion, the etch selectivity of the oxide layer 250B with respect to the substrate 200 is high and the spacers 250 are rarely damaged. Thus, the spacers 250 can sufficiently function as an etch barrier during a damascene word line formation process.

FIGS. 3A to 3E are cross-sectional views describing a method for fabricating a semiconductor device including a vertical channel transistor in accordance with a second embodiment. FIGS. 3A to 3E are cross-sectional views illustrated in accordance with a second direction B-B' of FIG. 2A.

Figure 3A:
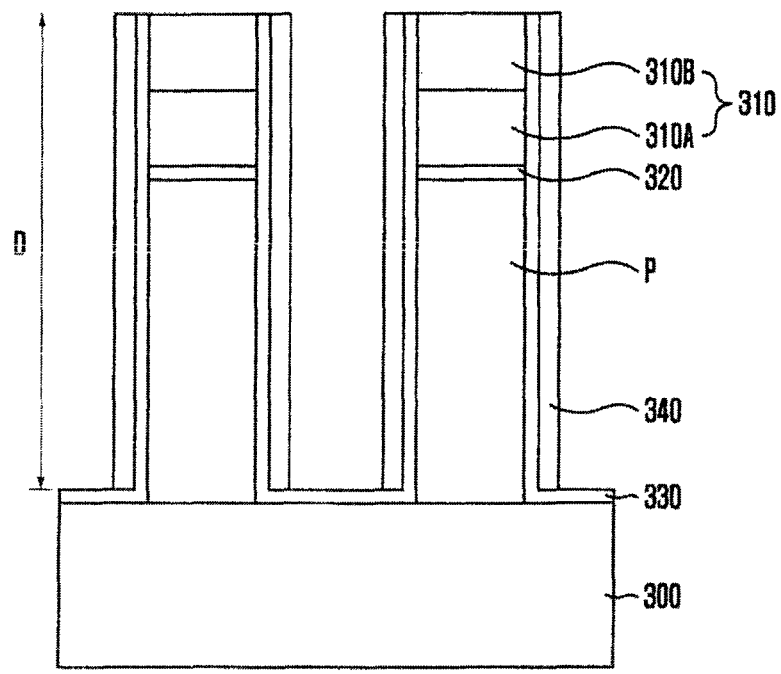
FIGS. 3A to 3E are cross-sectional views describing a method for fabricating a semiconductor device including a vertical channel transistor in accordance with the second embodiment.

Referring to FIG. 3A, island-type first hard mask patterns 310 are formed above a substrate 300. Pillar patterns are formed by etching the substrate to a certain depth D with the first mask patterns as etch barriers. Herein, the width of the upper portion and the width of the lower portion of the pillar patterns P have substantially the same width. That is, in the bar-type pillar patterns P, the widths of the upper portion and the lower portion have a difference within several nanometers.

The first hard mask patterns 310 preferably include a nitride layer 310A in the lower portion and an oxide layer 310B in the upper portion. In the lower portion of the first hard mask patterns 310, a pad oxide layer 320 can be formed.

A gate insulation layer 330 is formed encapsulating the resultant pillar patterns P and over the substrate. A conductive layer 340 for a surrounding gate electrode is formed on sidewalls of the first hard mask patterns 310, the pad oxide layer 320, and the pillar patterns P. Herein, the conductive layer 340 for a surrounding gate electrode is formed to a thickness that leaves a center gap between the pillar patterns P open.

Impurity ions are implanted into the substrate 300 between the pillar patterns P to form an impurity region (not shown) for a bit line.

Figure 3B:
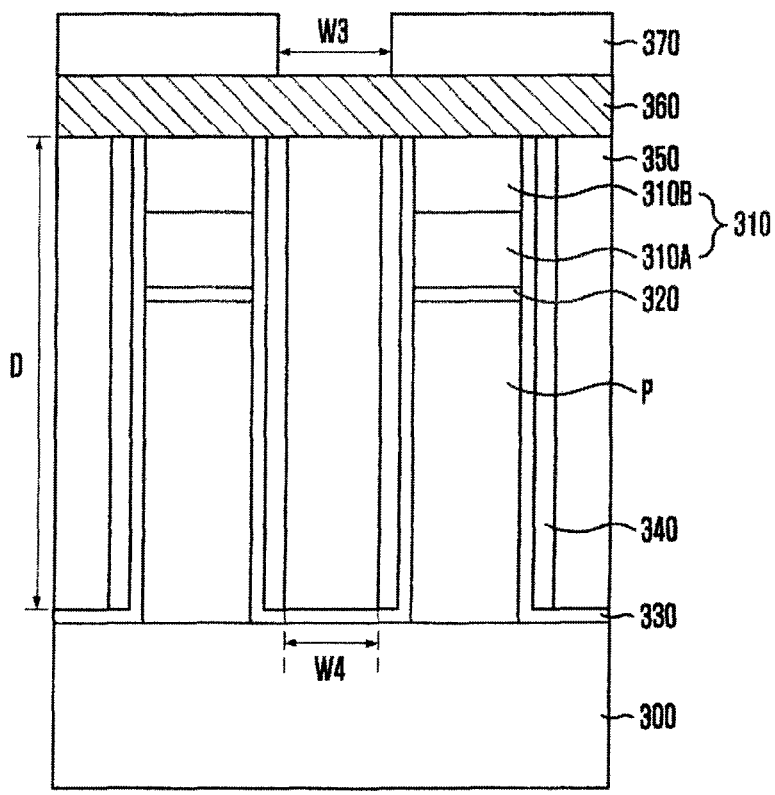

Referring to FIG. 3B, a sacrificial layer 350 is deposited surrounding a resultant structure including the impurity region for a bit line filling the gap between the pillar patterns P.

Herein, the sacrificial layer 350 preferably includes an SOC layer. The SOC layer has excellent gap fill characteristics and thus, it is possible to completely fill the gap between the pillar patterns P. The SOC layer also has excellent planarization characteristics. Furthermore, since an etch selectivity of the SOC layer with respect to the oxide layer is high, the SOC layer can be selectively removed by a plasma strip process while leaving the oxide layer and the other layers.

Second hard mask patterns 360 are formed above the resultant structure. Line-type photoresist patterns 370 are formed above the second hard mask patterns 360 covering the pillar patterns P and exposing a region for an isolation trench T.

Herein, a third width W3 between the photoresist patterns 370 is wider than a fourth width W4 of the region for the isolation trench T. Herein, the fourth width W4 of the region for the isolation trench T indicates the width between neighboring pillar patterns P. Specifically, the fourth width W4 indicates the width of the substrate 300 exposed by the conductive layer 340 for a surrounding gate electrode formed on sidewalls of the pillar patterns P.

Figure 3C:
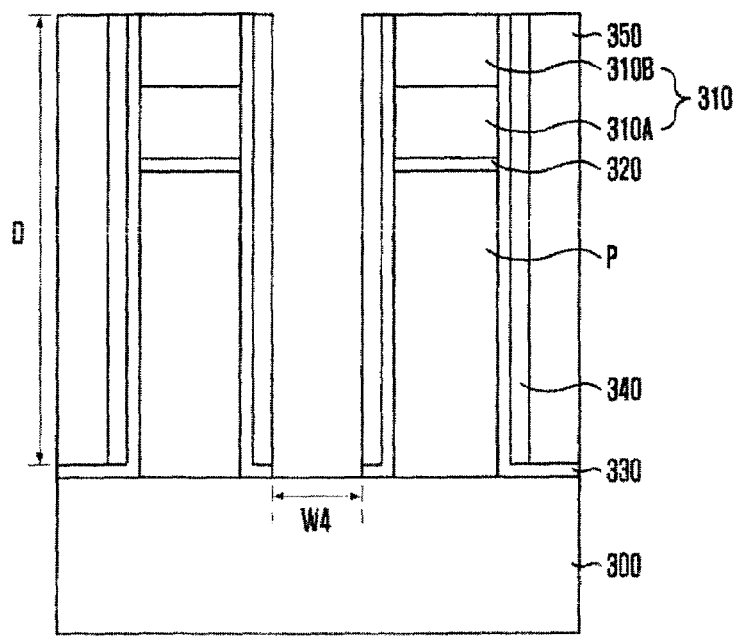

Referring to FIG. 3C, the second hard mask patterns 360 and the sacrificial layer 350 are etched by using the photoresist patterns 370 as an etch barrier to expose the substrate 300 in the region for the isolation trench between the pillar patterns P.

When the sacrificial layer 350 only includes the SOC layer, the sacrificial layer 350 can be removed while leaving the other layers. The third width W3 between the photoresist patterns 370 is wider than the fourth width W4 of the region for the isolation trench T. Thus, a not open phenomenon can be prevented. Furthermore, a plurality of regions for isolation trenches have a fourth width W4. Particularly, even though an opening of the photoresist patterns 370 leans to one side, the substrate 300 in the region for the isolation trench with the fourth width W4 can be exposed.

Figure 3D:
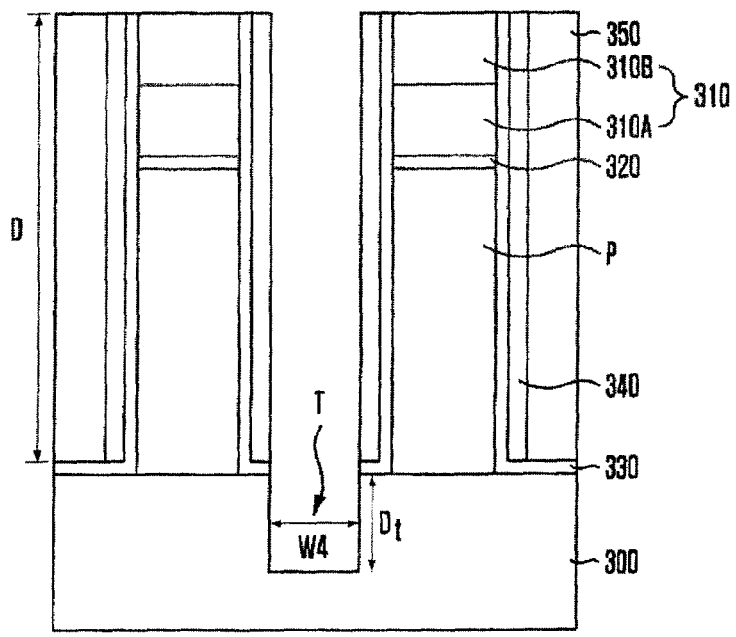

Referring to FIG. 3D, the substrate 300 exposed when the sacrificial layer 350 is removed is selectively etched to a certain depth $D_t$. Thus, the isolation trench T extending perpendicular to the upper surface of the substrate 300 is formed in the substrate 300 between the pillar patterns P. Herein, since the substrate 300 exposed by an amount of the fourth width W4, the isolation trench T is etched to have the same width.

Figure 3E:
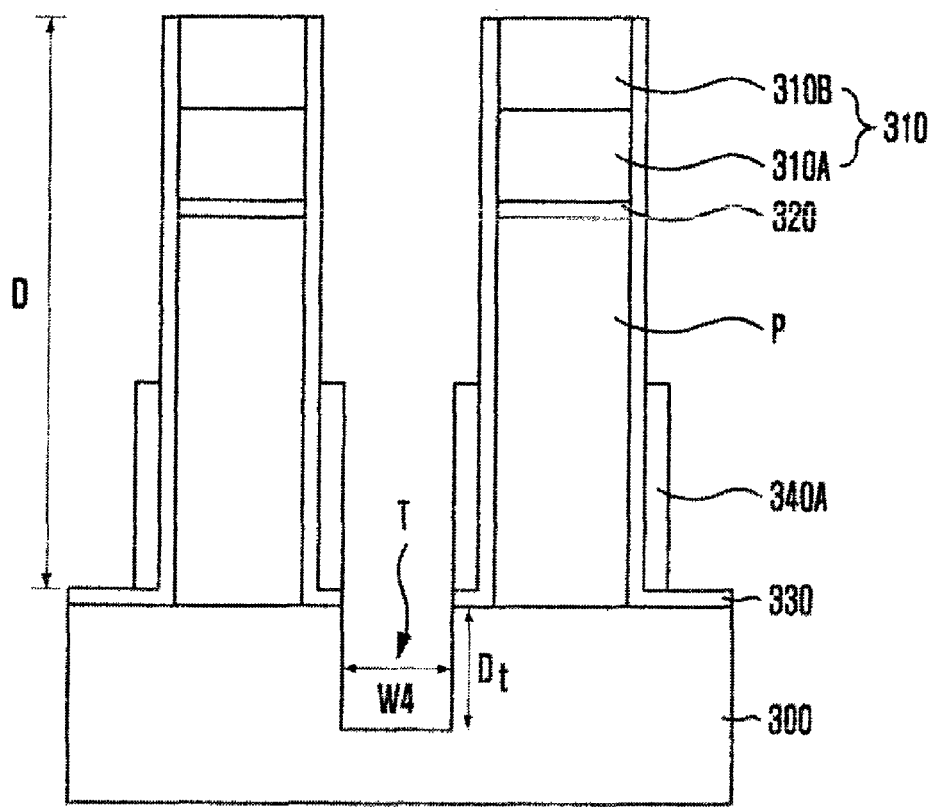

Referring to FIG. 3E, the sacrificial layer 350 remaining in the gap between the pillar patterns P is removed. The conductive layer 340 for a surrounding gate electrode formed surrounding the first hard mask patterns 310, the pad oxide layer 320, and the upper portion of the pillar patterns P is removed. Thus, surrounding gate electrode patterns 340A are formed on the lower sidewalls of the pillar patterns P.

In the second embodiment, the SOC layer fills the gap between the pillars and the isolation trench is formed. Thus, the damage to the spacers formed on the sidewalls of the pillar patterns is minimized. Thus, the surrounding gate electrode and the pillar patterns are not exposed or damaged.

Furthermore, when the photoresist patterns for the isolation trench are formed, the width between the photoresist patterns is wider than that of the isolation trench. Thus, the not open phenomenon is prevented and the isolation trench has narrower width.

Thus, the characteristics of the semiconductor device are improved and the efficiency and quality of the semiconductor fabrication process are increased.

While the various exemplary embodiments have been described, it will be apparent to those skilled in the art that various changes and modifications may be made without departing from the spirit and scope as defined in the following claims.

What is claimed is:

1. A method for forming a vertical channel transistor in a semiconductor device, the method comprising:
    providing a substrate;
    forming pillar patterns extending perpendicular from the upper surface of the substrate;
    forming a spin on carbon (SOC) layer in a gap region between the pillar patterns;
    forming photoresist patterns above a resultant structure where the SOC layer is filled while exposing a region for an isolation trench;
    etching the SOC layer between the photoresist pattern exposing the region for the isolation trench; and
    etching the exposed structure to a certain depth forming the isolation trench.

2. The method of claim 1, wherein the gap region between the photoresist patterns is wider than a width of the region for the isolation trench.

3. The method of claim 1, after forming the isolation trench, further comprising removing the SOC layer remaining in the gap region between the pillar patterns.

4. The method of claim 3, wherein the SOC layer is removed through a plasma strip process.

5. The method of claim 1, after forming the pillar patterns, further comprising:
    forming a gate insulation layer to encapsulate a resultant structure including the pillar patterns;
    forming a conductive layer surrounding lower sidewalls of the pillar patterns; and
    forming spacers over a resultant structure including the conductive layer.

6. The method of claim 5, wherein the spacers include an oxide layer in an upper portion and a nitride layer in a lower portion.

7. The method of claim 1, wherein an upper portion and a lower portion of the pillar patterns have substantially the same width.

8. The method of claim 7, after forming the pillar patterns, further comprising:
    forming a gate insulation layer encapsulating the resultant pillar patterns and above the substrate; and
    forming a conductive layer for a surrounding gate electrode on sidewalls of the pillar patterns including the gate insulation layer.

9. The method of claim 8, after forming the isolation trench, further comprising:
    removing the SOC layer remaining in the gap region between the pillar patterns; and
    removing the conductive layer for a surrounding gate electrode formed on an upper portion of the sidewalls of the pillar patterns to form a surrounding gate electrode surrounding a portion of the pillar patterns.

10. A method for forming a vertical channel transistor in a semiconductor layer, the method comprising:
    providing a substrate;
    forming pillar patterns extending perpendicularly from an upper surface of the substrate;
    forming spacers encapsulating the resultant pillar patterns and above the substrate;
    forming a sacrificial layer having a high etch selectivity with respect to the spacers in a gap region between the pillar patterns;
    forming photoresist patterns above the pillar patterns where the sacrificial layer is formed while exposing the substrate in a region for an isolation trench, wherein the width of the photoresist patterns is wider than the width of the region to be etched for the isolation trench;
    removing the sacrificial layer by using the photoresist patterns as an etch barrier thereby exposing the substrate in the region for the isolation trench; and
    etching the exposed substrate to a certain depth thereby exposing the isolation trench.

11. The method of claim 10, wherein the spacers include an oxide layer in an upper portion and a nitride layer in a lower portion.

12. The method of claim 11, wherein the sacrificial layer includes a material having a high etch selectivity with respect to the oxide layer.

13. The method of claim 12, wherein the sacrificial layer includes a SOC layer.

14. The method of claim 10, after forming the isolation trench, further comprising removing the sacrificial layer remaining in a gap region between the pillar patterns.

15. The method of claim 14, when the sacrificial layer includes the SOC layer, removing the sacrificial layer is performed through a plasma strip process.

* * * * *